(12) United States Patent
Nakata et al.

(10) Patent No.: US 8,740,409 B2
(45) Date of Patent: Jun. 3, 2014

(54) LIGHT-EMITTING-ELEMENT MOUNTING PACKAGE, LIGHT EMITTING DEVICE, BACKLIGHT, AND LIQUID CRYSTAL DISPLAY DEVICE

(75) Inventors: Hidehiko Nakata, Miyagi (JP);
Takayuki Kawasumi, Kanagawa (JP);
Akihiko Memezawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 250 days.

(21) Appl. No.: 12/710,689

(22) Filed: Feb. 23, 2010

(65) Prior Publication Data

US 2010/0231824 A1 Sep. 16, 2010

(30) Foreign Application Priority Data

Mar. 11, 2009 (JP) .................. 2009-058388

(51) Int. Cl.
*F21S 8/02* (2006.01)

(52) U.S. Cl.
USPC ............ 362/249.02; 362/311.02; 362/296.01; 362/612; 362/613

(58) Field of Classification Search
USPC ............... 362/612, 613, 249.02, 311.02, 97.3
See application file for complete search history.

(56) References Cited

U.S. PATENT DOCUMENTS

| | | | | |
|---|---|---|---|---|
| 6,953,255 B2 * | 10/2005 | Horiuchi et al. | ............. | 362/611 |
| 7,175,329 B1 * | 2/2007 | Chou | ............. | 362/612 |
| 7,455,423 B2 * | 11/2008 | Takenaka | ............. | 362/231 |
| 7,506,998 B2 * | 3/2009 | Ansems et al. | ............. | 362/245 |
| 7,524,087 B1 * | 4/2009 | Aizar et al. | ............. | 362/267 |
| 2004/0232536 A1 * | 11/2004 | Fukuzumi | ............. | 257/684 |
| 2006/0239006 A1 * | 10/2006 | Chaves et al. | ............. | 362/294 |
| 2007/0001188 A1 | 1/2007 | Lee | | |
| 2007/0002554 A1 * | 1/2007 | Lim | ............. | 362/97 |
| 2007/0147047 A1 * | 6/2007 | Wu | ............. | 362/311 |
| 2007/0217198 A1 * | 9/2007 | Alessio | ............. | 362/268 |
| 2007/0236929 A1 * | 10/2007 | Hung et al. | ............. | 362/231 |
| 2007/0263383 A1 * | 11/2007 | Ansems et al. | ............. | 362/231 |
| 2007/0274093 A1 * | 11/2007 | Haim et al. | ............. | 362/561 |
| 2008/0031009 A1 * | 2/2008 | Kodaira et al. | ............. | 362/612 |
| 2008/0062686 A1 * | 3/2008 | Hoelen et al. | ............. | 362/240 |
| 2008/0101084 A1 * | 5/2008 | Hsu | ............. | 362/612 |
| 2008/0101085 A1 * | 5/2008 | Lin et al. | ............. | 362/612 |
| 2008/0144334 A1 * | 6/2008 | Shin et al. | ............. | 362/612 |
| 2008/0186702 A1 * | 8/2008 | Camras et al. | ............. | 362/231 |
| 2008/0273340 A1 * | 11/2008 | Ng et al. | ............. | 362/373 |
| 2008/0316741 A1 * | 12/2008 | Lee | ............. | 362/231 |
| 2009/0016066 A1 * | 1/2009 | Chen | ............. | 362/308 |
| 2009/0021961 A1 * | 1/2009 | Yao et al. | ............. | 362/613 |
| 2010/0097808 A1 * | 4/2010 | Jurik | ............. | 362/296.01 |
| 2011/0133225 A1 * | 6/2011 | Jurik | ............. | 257/89 |

FOREIGN PATENT DOCUMENTS

JP 2007-507910 3/2007

* cited by examiner

*Primary Examiner* — Jong-Suk (James) Lee
*Assistant Examiner* — Bryon T Gyllstrom
(74) *Attorney, Agent, or Firm* — Oblon, Spivak, McClelland, Maier & Neustadt, L.L.P.

(57) ABSTRACT

A small and thin, light-emitting-element mounting package is provided, in which light emitting elements may by independently controlled despite a side view type package, and a light emitting device using the package is provided. The light-emitting-element mounting package includes a lead frame. The lead frame has at least one set of a structure including a lower conductor layer, an insulating layer and an upper conductor layer in this order, and a mounting area exposed on a surface of the lower conductor layer.

20 Claims, 7 Drawing Sheets

LIGHT-EMITTING-ELEMENT MOUNTING PACKAGE, LIGHT EMITTING DEVICE, BACKLIGHT, AND LIQUID CRYSTAL DISPLAY DEVICE

BACKGROUND OF THE INVENTION

1. Field of the Invention

The present invention relates to a side view type light-emitting-element mounting package, and to a light emitting device, a backlight, and a liquid crystal display device, those using the package.

2. Description of Related Art

In a liquid crystal display (LCD) as a thin display device, a backlight is used for irradiating light over the whole surface of a liquid crystal panel from the back. Recently, aiming to expand a color gamut, three-color light emitting diodes (LED) of red (R), blue (B) and green (G) are noticed as the backlight in place of a cold cathode tube or hot cathode tube. In the LED backlight, a plurality of three-color light emitting diodes are arranged at certain intervals, and white light may be produced by turning on the light emitting diodes at the same time.

A light emitting device having such light emitting diodes as a backlight includes, for example, a light emitting device as disclosed in Published Japanese Translation of a PCT International Application No. 2007-507910 (FIGS. 1 and 2). The light emitting device uses a small and thin, side view type LED package. The device uses a package having two independent leads to allow two-terminal input, in which two light emitting diodes are connected in series or parallel so that power may be supplied to the two elements through the two terminals.

SUMMARY OF THE INVENTION

However, the following difficulty has existed in the above light emitting device: since the two light emitting diodes are connected in series or parallel between two terminals, the elements may not be independently controlled. Specifically, in the case where the light emitting diodes are connected in series, since each diode is driven with a current having one value, a luminance ratio is fixed. In contrast, in the case where the light emitting diodes are connected in parallel, since a value of a current flowing into each diode is determined by a resistance value of the element, the current value may not be adjusted, as a result, a luminance ratio between the diodes is fixed. Therefore, a light emitting color has been hardly adjusted in the existing light emitting device.

The Published Japanese Translation of a PCT International Application No. 2007-507910 discloses another example of a light emitting device where four pads are provided within a package, and light emitting diodes of respective colors are mounted on three of the pads. The remaining one pad is bonded with wires connecting the pad to the respective elements. In the light emitting device configured in this way, since the three light emitting diodes are connected to different pads from one another, light output of each light emitting diode may be independently controlled. However, the following difficulty has existed in the light emitting device configured in the way: since four terminals are disposed, the package is inevitably a top view type package, leading to a large planar size, and consequently size is hardly reduced.

It is desirable to provide a small and thin, light-emitting-element mounting package in which light emitting elements may be independently controlled despite a side view type, and provide a light emitting device using the package. In addition, it is desirable to provide a backlight and a liquid crystal display device having the light emitting device each.

A light-emitting-element mounting package according to an embodiment of the invention has a lead frame, in which the lead frame has at least one set of a structure (three-dimensional structure) including a lower conductor layer, an insulating layer and an upper conductor layer in this order, and has a mounting area exposed on a surface of the lower conductor layer.

In the package, each lower conductor layer of the set of three-dimensional structure acts as a first electrode terminal, and each upper conductor layer thereof acts as a second electrode terminal, and the same structure is further provided on the three-dimensional structure, thereby the number of electrode terminals may be increased.

A light emitting device according to an embodiment of the invention includes the light-emitting-element mounting package according to the embodiment of the invention, the package being mounted with light emitting elements such as light emitting diodes.

In the light emitting device according to the embodiment of the invention, at least two electrode terminals may be provided on each lead frame, and therefore one or several light emitting elements may be independently supplied with electric current, and thus may be independently controlled.

A backlight according to an embodiment of the invention has a light emitting device emitting white light, and a light guide plate guiding light emitted from the light emitting device in a planar direction, in which the light emitting device includes the light emitting device according to the embodiment of the invention.

A liquid crystal display device according to an embodiment of the invention has the backlight including the above-mentioned light emitting device, and a liquid crystal display panel polarizing light emitted from the backlight.

In the light-emitting-element mounting package according to the embodiment of the invention, since the lead frame is made into the three-dimensional structure including the lower conductor layer, the insulating layer and the upper conductor layer in this order, a small and thin, side view type package may be achieved, in which light emitting elements may be independently controlled.

According to the light emitting device, the backlight and the liquid crystal display device of the embodiments of the invention, since the package according to the embodiment of the invention is provided, a light emitting color may be controlled by independently driving elements.

Other and further objects, features and advantages of the invention will appear more fully from the following description.

DETAILED DESCRIPTION OF THE PREFERRED EMBODIMENTS

Hereinafter, preferred embodiments of the invention will be described in detail with reference to drawings. The description is made in the following sequence.

1. First embodiment (using a two-element mounting type package)
2. Second embodiment (using a three-element mounting type package)
3. Third embodiment (improving a heat release characteristic of the two-element mounting type of package)
4. Fourth embodiment (improving a heat release characteristic of the three-element mounting type package)
5. Fifth embodiment (modification of the two-element mounting type package)
6. Backlight and liquid crystal display device
7. Application example of liquid crystal display device
8. Modifications

First Embodiment

Configuration of Display Device

Figure 1A:
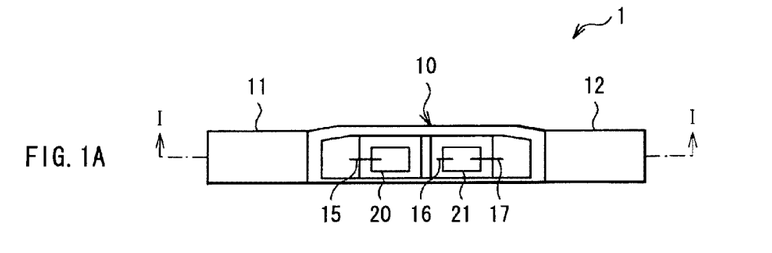
FIG. 1A is a plan view of a light emitting device according to a first embodiment of the invention.
Figure 1B:
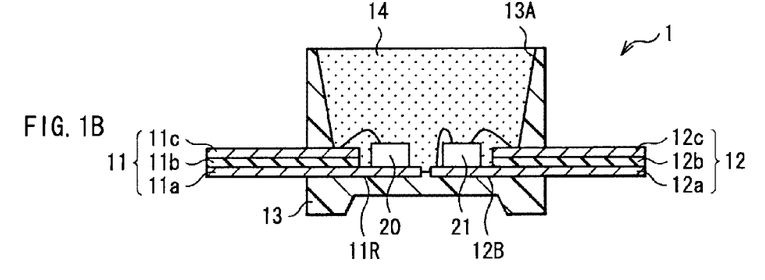
FIG. 1B is a section view along a line I-I of FIG. 1A.

FIGS. 1A and 1B show a configuration of a light emitting device 1 according to a first embodiment of the invention. The light emitting device 1 includes a light-emitting-element mounting package (hereinafter, called package) 10 mounted with light emitting elements being a red light emitting diode (hereinafter, called red LED) 20 and a blue light emitting diode (hereinafter, called blue LED) 21.

The package 10 includes two thin, long and rectangular lead frames 11 and 12 integrated with each other by a mold portion 13. The lead frames 11 and 12 have the same structure here. Specifically, the lead frame 11 has a structure (three-dimensional structure) having a lower conductor layer 11a, an insulating layer 11b and an upper conductor layer 11c in this order, and the lower conductor layer 11a acts as a first electrode terminal, and the upper conductor layer 11c acts as a second electrode terminal. That is, the lead frame 11 has two terminals in one. The lower conductor layer 11a is longer than the insulating layer 11b thereon and the upper conductor layer 11c further thereon, and an exposed portion of the lower conductor layer 11a is formed as a mounting area 11R for the red LED 20.

Similarly, the lead frame 12 has a structure (three-dimensional structure) having a lower conductor layer 12a, an insulating layer 12b and an upper conductor layer 12c in this order, and the lower conductor layer 12a acts as a first electrode terminal, and the upper conductor layer 12c acts as a second electrode terminal. The lead frame 12 also has two terminals in one. The lower conductor layer 12a is longer than the insulating layer 12b thereon and the upper conductor layer 12c further thereon, and an exposed portion of the lower conductor layer 12a is formed as a mounting area 12B for the blue LED 21.

The lower conductor layers 11a and 12a and the upper conductor layers 11c and 12c, those configuring the lead frames 11 and 12, are formed of a metal material having high reflectance in a wavelength range of red to blue, for example, Ag (silver) or Al (aluminum), respectively. Furthermore, each lower conductor layer may have a double-layer structure where a metal layer of Ag or Al having high reflectance is provided on a surface of a metal layer of Cu (copper) or the like having high heat conductivity. The insulating layers 11b and 12b are formed of a material such as resin including glass epoxy or polyimide, or ceramic. While the lead frames 11 and 12 have the same structure herein, the lead frames 11 and 12 may have different structures from each other.

The mold portion 13 is formed of, for example, white resin, and has a cavity 13A. The lead frame 11 and 12 are disposed such that the mounting area 11R and 12B side are located within the cavity 13A. The cavity 13A is filled with a phosphor-mixed resin 14. The phosphor-mixed resin 14 is mixed with a phosphor being excited by blue light from the blue LED 21 and emitting green light thereby. Silicone resin, acrylic resin, epoxy resin or the like is used for resin of the phosphor-mixed resin.

The red LED 20 has an upper electrode and a lower electrode, and is bonded on a lower electrode side to the mounting area 11R of the lead frame 11. A conductive binder such as Ag (silver) paste is used as a binder. The upper electrode of the red LED 20 is connected to the upper conductor layer 11c of the lead frame 11 by a bonding wire 15 including Au (gold).

In contrast, the blue LED 21 has two electrodes on one surface (top) side. The blue LED 21 is bonded on a bottom side to the mounting area 12B of the lead frame 12 by a binder including a material having high reflectance in a wavelength range of red to blue, for example, white paste. One electrode of the blue LED 21 is connected to the lower conductor layer 12a, and the other electrode is connected to the upper conductor layer 12c by wires 16 and 17 including Au, respectively.

Figure 2:
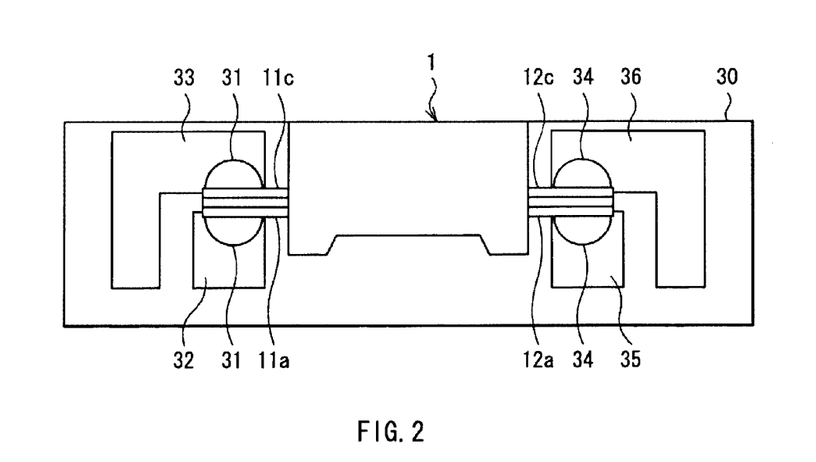
FIG. 2 is a view showing a mounting state of the light emitting device of FIGS. 1A and 1B on a mounting board.

FIG. 2 shows a state where the light emitting device 1 is mounted on a mounting board 30. The lower conductor layer 11a and the upper conductor layer 11c of the lead frame 11 are electrically connected to wiring patterns 32 and 33 on the mounting board 30 by solder 31, respectively. The lower conductor layer 12a and the upper conductor layer 12c of the lead frame 12 are electrically connected to wiring patterns 35 and 36 on the mounting board 30 by solder 34, respectively. Electric current is supplied to the red LED 20 within the package 10 through the wiring patterns 32 and 33, and to the blue LED 21 through the wiring patterns 35 and 36, so that the red LED 20 and to the blue LED 21 may be driven.

Operation

In the light emitting device 1 of the embodiment having the above configuration, electric current supplied through the wiring patterns 32 and 33 is supplied to the red LED 20 through the lower conductor layer 11a and the upper conductor layer 11c of the lead frame 11, so that the red LED 20 generates red light. The red light is transmitted by the phosphor-mixed resin 14. A desired current is supplied to the red LED 20 independently of the blue LED 21.

In contrast, electric current supplied through the wiring patterns 35 and 36 is supplied to the blue LED 21 through the lower conductor layer 12a and the upper conductor layer 12c of the lead frame 12, so that the blue LED 21 generates blue light. A desired current may be supplied even to the blue LED 21 independently of the red LED 20. The generated blue light partially excites the phosphor in the phosphor-mixed resin 14 so that the blue light is converted into green light, and the remaining blue light is transmitted by the phosphor-mixed resin 14. In this way, in the embodiment, three primary colors of light, red, green and blue, may be generated by the two light emitting elements (the red LED 20 and the blue LED 21), and consequently white light is radiated from the cavity 13A of the package 10.

Advantages

As hereinbefore, in the embodiment, since the lead frame 11 is made into the three-dimensional structure including the lower conductor layer 11a, the insulating layer 11b, and the upper conductor layer 11c, those being thin and long, the lead frame has the mounting area 11R and two terminals in one. The same is true in the lead frame 12. The lead frames 11 and 12 are butted together and integrated by the mold portion 13, thereby a small and thin package 10 may be achieved. Therefore, for example, thickness of the package may be made 0.8 mm or less, and preferably made 0.6 mm or less, enabling use of the package as a side view type package.

In addition, in the embodiment, since each of the lead frames 11 and 12 has two terminals in one, the red LED 20 and the blue LED 21 may be independently driven, so that each element may be independently supplied with a desired current. Accordingly, a color of light obtained by the light emitting device 1 may be adjusted.

Hereinafter, other embodiments of the invention are described. In the following description of the embodiments, the same components as those in the first embodiment are marked with the same reference numerals or signs, and description of them are omitted.

2. Second Embodiment

Figure 3A:
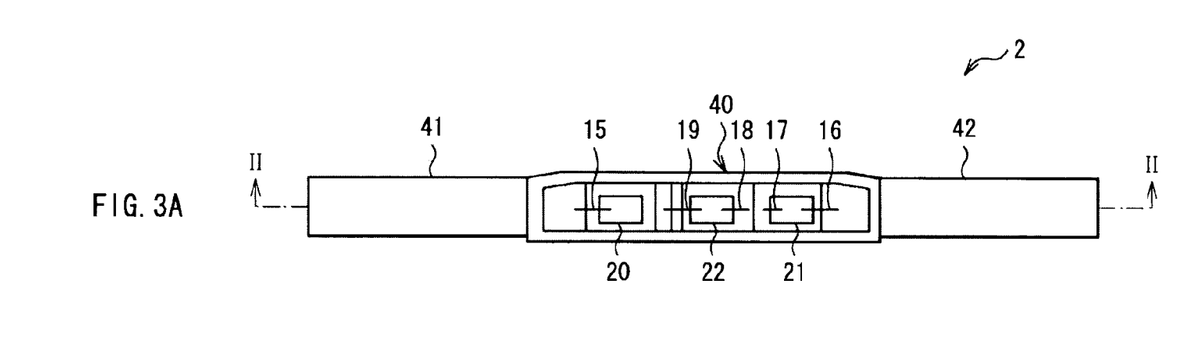
FIG. 3A is a plan view of a light emitting device according to a second embodiment of the invention.
Figure 3B:
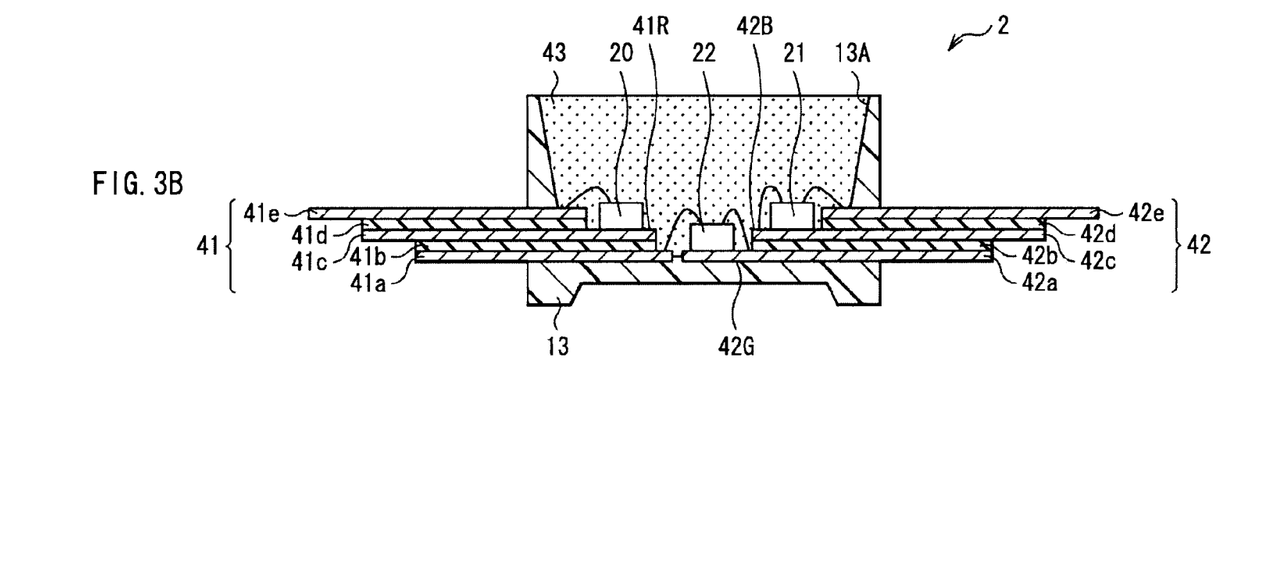
FIG. 3B is a section view along a line II-II of FIG. 3A.

FIGS. 3A and 3B show a configuration of a light emitting device 2 according to a second embodiment of the invention. The light emitting device 2 is different from the light emitting device 1 according to the first embodiment in that the light emitting device 2 includes thin, long and rectangular lead frames 41 and 42 having three terminals each, and six terminals in total.

Configuration of Light Emitting Device 2

The light emitting device 2 includes three light emitting elements being red LED 20, blue LED 21 and green LED 22 mounted in a package 40.

The package 40 includes two rectangular lead frames 41 and 42 integrated with each other by a mold portion 13. The lead frame 41 is mounted with red LED 20, and the lead frame 42 is mounted with blue LED 21 and green LED 22. Specifically, the lead frame 41 has a three-dimensional structure including a lower conductor layer 41a, an insulating layer 41b, an intermediate conductor layer 41c, an insulating layer 41d and an upper conductor layer 41e in this order. The lower conductor layer 41a acts as a first electrode terminal, the intermediate conductor layer 41c acts as a second electrode terminal, and the upper conductor layer 41e acts as a third electrode terminal. That is, the lead frame 41 has three terminals in one. The intermediate conductor layer 41c is longer than the insulating layer 41d thereon and the upper conductor layer 41e further thereon, and an exposed portion of the intermediate conductor layer 41c is formed as a mounting area 41R for the red LED 20. Similarly, the lower conductor layer 41a (first electrode terminal) is longer than the insulating layer 41b thereon and the intermediate conductor layer 41c further thereon, and an exposed portion of the lower conductor layer 41a is electrically connected with, for example, one electrode of the green LED 22 mounted on a lead frame 42 side.

The lead frame 42 has a structure including a lower conductor layer 42a, an insulating layer 42b, an intermediate conductor layer 42c, an insulating layer 42d and an upper conductor layer 42e in this order. The lower conductor layer 42a acts as a first electrode terminal, the intermediate conductor layer 42c acts as a second electrode terminal, and the upper conductor layer 42e acts as a third electrode terminal. The lead frame 42 has three terminals in one. The lower conductor layer 42a is longer than the insulating layer 42b thereon and the intermediate conductor layer 42c further thereon, and an exposed portion of the lower conductor layer 42a is formed as a mounting area 42G for the green LED 22. The intermediate conductor layer 42c is longer than the insulating layer 42d thereon and the upper conductor layer 42e further thereon, and an exposed portion of the layer 42c is formed as a mounting area 42B for the blue LED 21.

The lower conductor layers 41a and 42a, the intermediate conductor layers 41c and 42c, and the upper conductor layers 41e and 42e, those configuring the lead frames 41 and 42, are formed of a metal material having high reflectance in a wavelength range of red to blue, for example, Ag (silver) or Al (aluminum), respectively. Furthermore, each lower conductor layer may have a multilayer structure where a metal layer of Ag or Al having high reflectance is provided on a surface of a metal layer of Cu (copper) or the like having high heat conductivity. The insulating layers 41b, 41d, 42b and 42d are formed of a material such as resin including glass epoxy or polyimide, or ceramic.

The red LED 20 is bonded on a lower electrode side to the mounting area 41R of the lead frame 41. An upper electrode of the red LED 20 is connected to the upper conductor layer 41e by a bonding wire 15 including Au (gold) or the like. The blue LED 21 is bonded on a bottom side to the mounting area 42B of the lead frame 42. One electrode of the blue LED 21 is connected to the intermediate conductor layer 42c, and the other electrode is connected to the upper conductor layer 42e by wires 16 and 17 including Au (gold) or the like, respectively. The green LED 22 has two electrodes on one surface side (top side), and is bonded on a bottom side to the mounting area 42G of the lead frame 42. One electrode of the green LED 22 is connected to the lower conductor layer 42a, and the other electrode is connected to the lower conductor layer 41a of the other lead frame 41 by bonding wires 18 and 19, respectively.

A cavity 13A of the mold portion 13 is filled with a transparent resin 43 including silicone resin or the like.

Operation

In the light emitting device 2 of the embodiment, the red LED 20 is supplied with electric current through the intermediate conductor layer 41c and the upper conductor layer 41e of the lead frame 41, so that the red LED 20 generates red light. The blue LED 21 is supplied with electric current through the intermediate conductor layer 42c and the upper conductor layer 42e of the lead frame 42, so that the blue LED 21 generates blue light. The green LED 22 is supplied with electric current through the lower conductor layer 42a of the lead frame 42 and through the lower conductor layer 41a on a lead frame 41 side, so that the green LED 22 generates green light. All the red light, the blue light and the green light are transmitted by the transparent resin 43. In this way, in the embodiment, three primary colors of light, red, green and blue, may be generated by the three light emitting elements (the red LED 20, the blue LED 21 and the green LED 22), and consequently white light is radiated from the cavity 13A of the package 40.

Advantages

In the embodiment, since the lead frame 41 is made into the three-dimensional structure including the lower conductor layer 41a, the insulating layer 41b, the intermediate conductor layer 41c, the insulating layer 41d and the upper conductor layer 41e, those being thin and long, the lead frame 41 has the mounting area 41R and three terminals in one. Similarly, since the lead frame 42 is made into the three-dimensional structure including the lower conductor layer 42a, the insulating layer 42b, the intermediate conductor layer 42c, the insulating layer 42d and the upper conductor layer 42e, the lead frame 42 has the two mounting areas 42B and 42G and three terminals in one. Accordingly, the package 40 of the embodiment, which includes the lead frames 41 and 42 being butted together and integrated by the mold portion 13, is small and thin as in the first embodiment.

In addition, even in the embodiment, since each of the lead frames 41 and 42 has three terminals in one, the red LED 20, the blue LED 21 and the green LED 22 may be independently driven, so that each element may be independently supplied with a desired current. Accordingly, an emission light color may be adjusted even in the light emitting device 2.

3. Third Embodiment

Figure 4A:
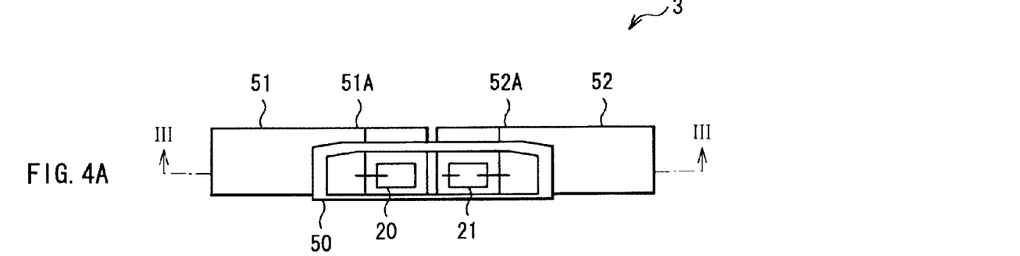
FIG. 4A is a plan view of a light emitting device according to a third embodiment of the invention.
Figure 4B:
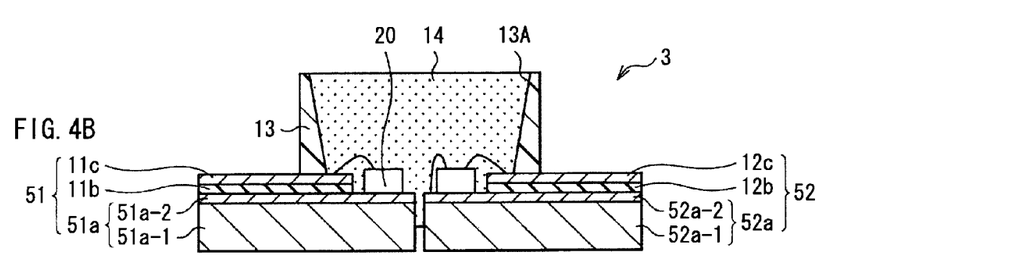
FIG. 4B is a section view along a line III-III of FIG. 4A.

FIGS. 4A and 4B show a configuration of a light emitting device 3 according to a third embodiment of the invention. The light emitting device 3 corresponds to a modification of the light emitting device of the first embodiment, which is modified to be improved in heat release.

A package 50 of the light emitting device 3 has lead frames 51 and 52. The lead frame 51 is the same as the lead frame 11 in the first embodiment in having a structure where a lower conductor layer 51a, an insulating layer 11b, and an upper conductor layer 11c are provided in this order. Similarly, the lead frame 52 is the same as the lead frame 12 in the first embodiment in having a structure where a lower conductor layer 52a, an insulating layer 12b, and an upper conductor layer 12c are provided in this order.

However, in the embodiment, the lead frames 51 and 52 are formed wide compared with the lead frames 11 and 12, and extend to the outside compared with a mold portion 13 on board-mounting-surfaces sides 51A and 52A of the lead frames 51 and 52, respectively. Moreover, the lower conductor layers 51a and 52a of the lead frames 51 and 52 are relatively thick compared with the upper conductor layers 11c and 12c (and thick compared with the lower conductor layers 11a and 12a of the lead frames 11 and 12 in the first embodiment), respectively. Thus, in the embodiment, the lower conductor layers 51a and 52a operate even as a heat release section each.

The lower conductor layers 51a and 52a include thin films (second layers 51a-2 and 52a-2) including Ag or Al having high reflectance in a wavelength range of red to blue, the thin films being formed on first layers 51a-1 and 51a-2 including a conductive material having high heat conductivity such as Cu (copper), respectively. The lower conductor layers 51a and 52a may be formed into a single-layer structure wholly including Ag or Al instead of the double-layer structure. Other configurations are the same as those in the first embodiment.

Figure 5:
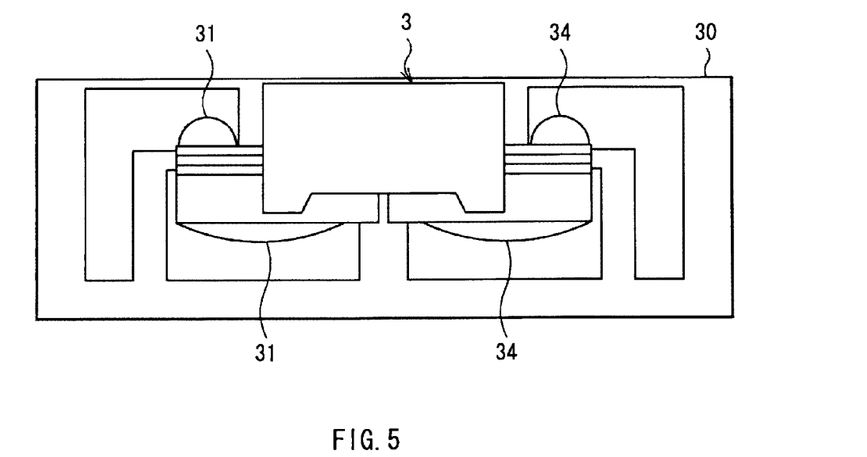
FIG. 5 is a view showing a mounting state of the light emitting device of FIGS. 4A and 4B on a mounting board.

The light emitting device 3 is mounted on a mounting board 30 by using solder 31 and 34 as shown in FIG. 5. Since the lead frames 51 and 52 extend to the outside compared with the mold portion 13 on the board-mounting-surface sides 51A and 52A, respectively, the lead frames 51 and 52 adhere to the mounting board 30, so that heat generated by the light emitting device 3 is conducted to the mounting board 30 via the lead frames 51 and 52.

In the light emitting device 3, the lower conductor layers 51a and 52a of the lead frames 51 and 52 are relatively thick compared with the upper conductor layers 51c and 52c, and besides, the first layers 51a-1 and 51a-2 are formed of copper having high heat conductivity. Accordingly, heat generated by each of the red LED 20 and the blue LED 21 is efficiently released to the mounting board 30 through each of the lower conductor layers 51a and 52a. This improves a heat release characteristic of the light emitting device 3. Other operation and effects are the same as those in the first embodiment.

4. Fourth Embodiment

Figure 6:
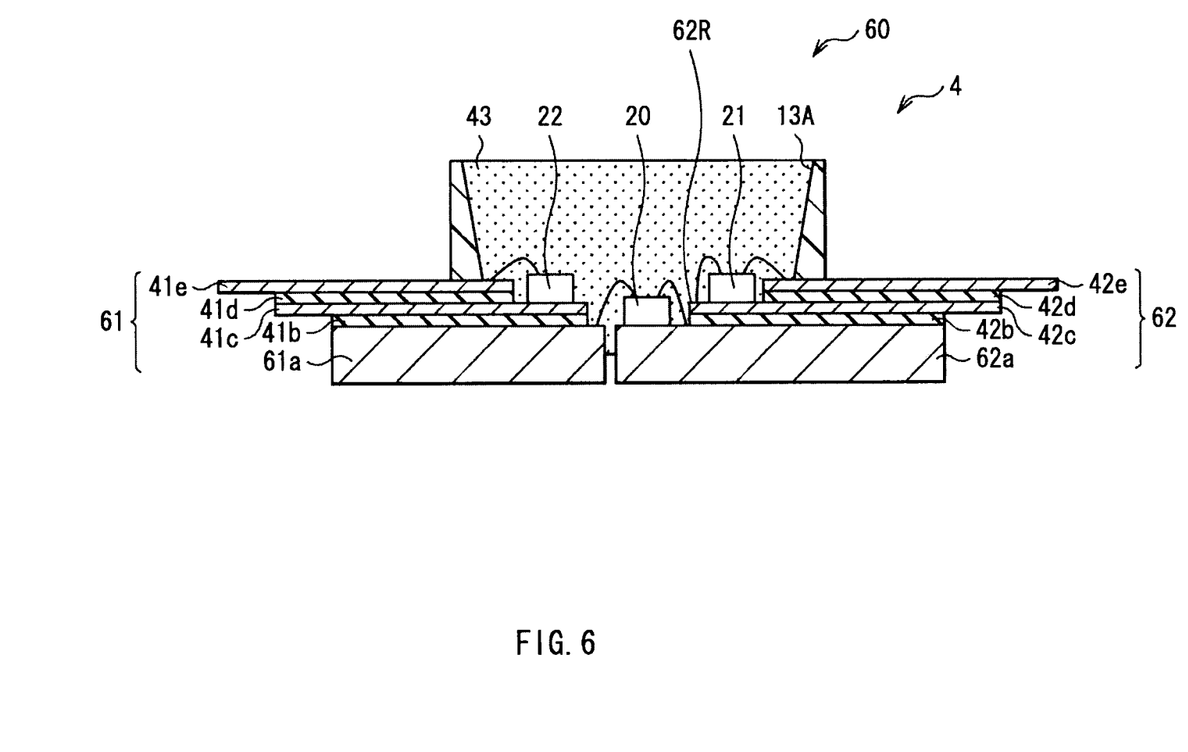
FIG. 6 is a section view of a light emitting device according to a fourth embodiment of the invention.

FIG. 6 shows a configuration of a light emitting device 4 according to a fourth embodiment of the invention. The light emitting device 4 corresponds to a modification of the light emitting device of the second embodiment, which is modified to be applied with the heat release structure of the third embodiment in order to improve heat release of the device.

A package 60 of the light emitting device 4 has lead frames 61 and 62. The lead frame 61 is the same as the lead frame 41 in the second embodiment in having a three-dimensional structure where a lower conductor layer 61a, an insulating layer 41b, and intermediate conductor layer 41c, an insulating layer 41d, and an upper conductor layer 41e are provided in this order. Similarly, the lead frame 62 is the same as the lead frame 42 in the second embodiment in having a three-dimensional structure where a lower conductor layer 62a, an insulating layer 42b, an intermediate conductor layer 42c, an insulating layer 42d, and an upper conductor layer 42e are provided in this order.

In the embodiment, the lower conductor layers 61a and 62a of the lead frames 61 and 62 are relatively thick compared with the upper conductor layers 41e and 42e, and thus have heat release capability, respectively. The red LED 20 is mounted in a mounting area 62R formed in the lower conductor layer 62a of the lead frame 62.

The red LED 20 is easily affected by heat compared with the blue LED 21 or the green LED 22, and therefore greatly decreased in luminance and greatly shifted in wavelength at high temperature. Therefore, in the embodiment, the red LED 20 is mounted in the mounting area 62R of the lower conductor layer 62a having heat release capability. A positional relationship between the green LED 22 and the blue LED 21 may be reversed from that shown in FIG. 6.

In the embodiment, since the red LED 20 being easily affected by heat is disposed in a heat release section (the lower conductor layer 62a) of the lead frame 62, heat from the red LED 20 may be effectively released.

5. Fifth Embodiment

Figure 7:
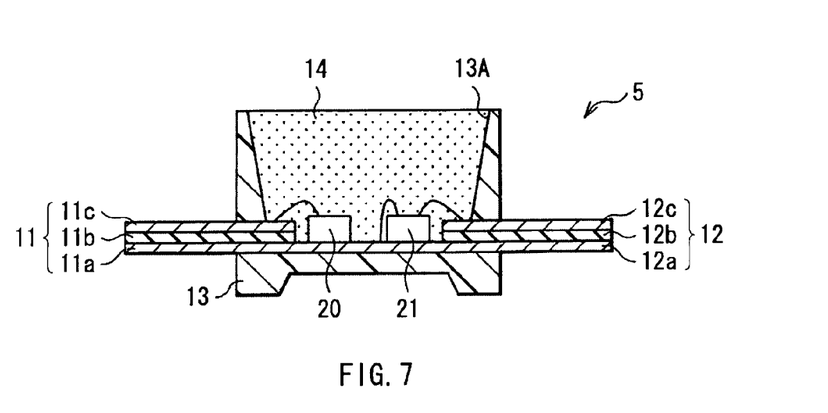
FIG. 7 is a section view of a light emitting device according to a fifth embodiment of the invention.

FIG. 7 shows a configuration of a light emitting device 5 according to a fifth embodiment of the invention. The light emitting device 5 corresponds to a modification of the package 10 of the first embodiment, which is modified in such a manner that the lower conductor layers 11a and 12a are formed to be a common electrode to each other so that the lead frames 11 and 12 are integrated. In the embodiment, since such a configuration is used, a wiring structure may be simplified.

Hereinafter, application examples of the light emitting devices 1 to 5 of the embodiment (representatively called light emitting device 1 below) are described.

6. Backlight and Liquid Crystal Display Device

Figure 8:
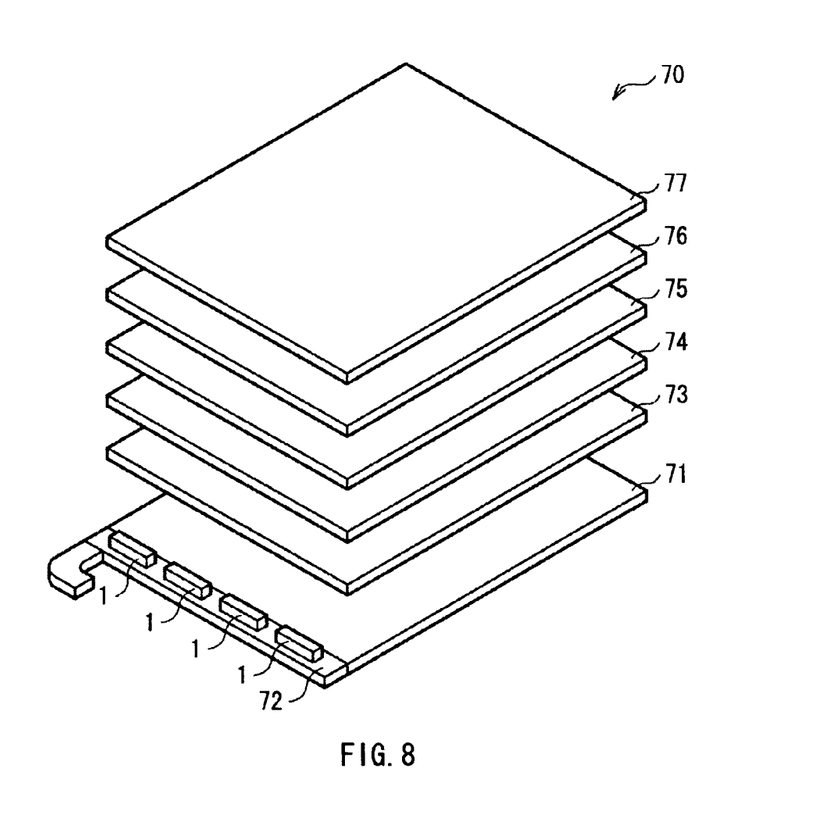
FIG. 8 is an exploded perspective view of a backlight.

FIG. 8 shows an exploded perspective configuration of a backlight 70. The light emitting devices 1 are provided on FPC (Flexible Printed Circuit Board) 72 disposed on a lateral side of a reflective sheet 71, and arranged along one side of the reflective sheet 71. A light guide plate 73 guiding light emitted by each light emitting device 1 in a planar direction, and a diffuser plate 74 diffusing light emitted upward from the light guide plate 73 are sequentially disposed on the reflective sheet 71. A first prism sheet 75, a second prism sheet 76, and a protective sheet 77 are sequentially disposed on the diffuser plate 74.

In such a backlight 70, light emitted by each light emitting device 1 is guided in a planar direction by the light guide plate 73, and light traveling downward is reflected upward by the reflective sheet 71. Light emitted upward from the light guide plate 73 is diffused by the diffuser plate 74, then transmitted by the first prism sheet 75, the second prism sheet 76, and the protective sheet 77.

Figure 9:
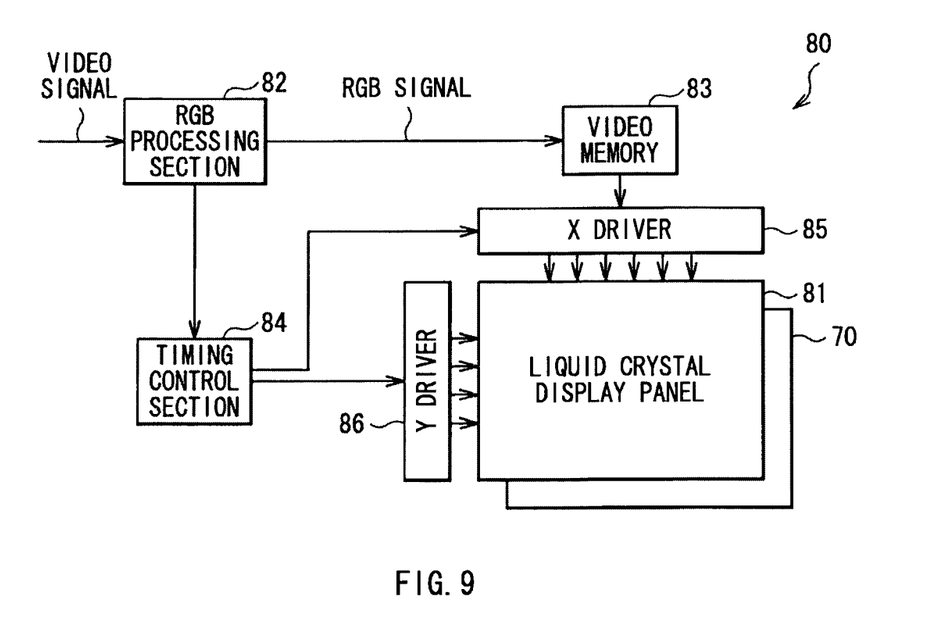
FIG. 9 is a block diagram showing a schematic configuration of a liquid crystal display device.

FIG. 9 shows a block configuration of a liquid crystal display device 80. The liquid crystal display device 80 has the above-mentioned backlight 70, and has a liquid crystal display panel 81 disposed in the front of the backlight 70. The liquid crystal display device 80 further has an RGB processing section 82, a video memory 83, a timing control section 84, an X driver 85, and a Y driver 86. The RGB processing section 82 is externally supplied with a video signal. The video memory 83 is a frame memory being inputted with an RGB signal generated by the RGB processing section 82, and holding the signal. The timing control section 84 (timing generator) controls the X driver 85 (data driver) and the Y driver 86 (gate driver) according to a signal inputted from the RGB processing section 82. The X driver 85 supplies a drive signal to the liquid crystal display panel 81, the drive signal being formed based on an RGB signal inputted from the video memory 83 and a control signal inputted from the timing control section 84. The Y driver 86 line-sequentially drives pixel electrodes (not shown) in the liquid crystal display panel 81 along a scan line. The liquid crystal display panel 81 displays a video image of a letter or figure according to signals inputted from the X driver 85 and the Y driver 86.

7. Application Example of Liquid Crystal Display Device 80

Figure 10A:
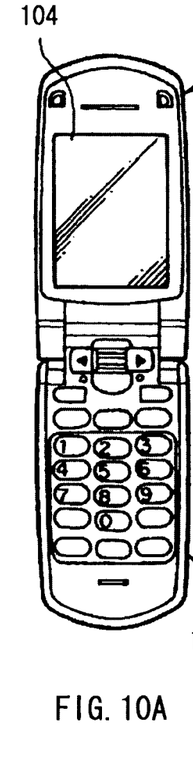
FIGS. 10A to 10G are outline drawings of a mobile phone as an example of a mobile device.
Figure 10B:
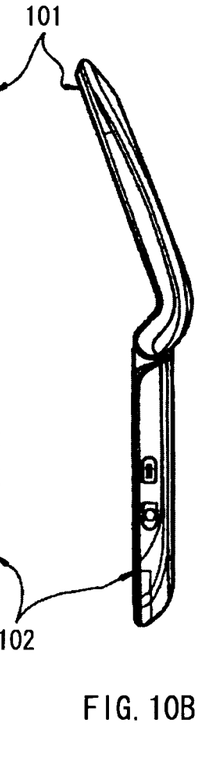
Figures 10C, 10G:
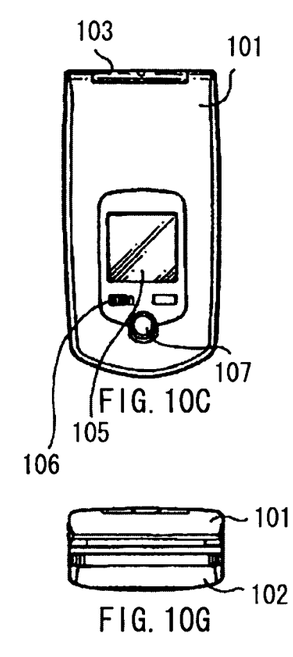
Figure 10D:
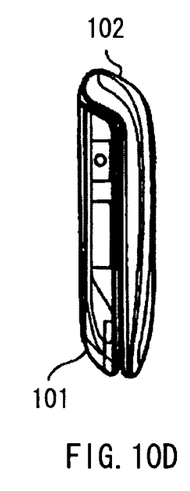
Figure 10E:
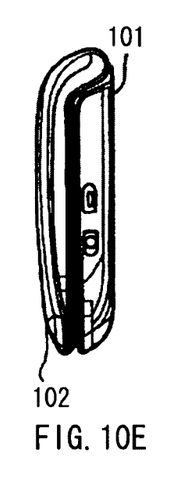
Figure 10F:
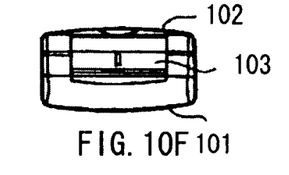

The liquid crystal display device 80 may be used as a display device of a mobile device or the like. FIGS. 10A to 10G show appearance of a mobile phone as an example of a mobile device applied with the liquid crystal display device 80. FIG. 10A is a front view of the mobile phone in an opened state, FIG. 10B is a side view of FIG. 10A, FIG. 10C is a front view of the mobile phone in a closed state, FIG. 10D is a left side view of FIG. 10C, FIG. 10E is a right side view thereof, FIG. 10F is a plan view thereof, and FIG. 10G is a bottom view thereof. For example, the mobile phone includes an upper housing 101 and a lower housing 102 connected to each other by a connection (hinge) 103, and has a display 104, a sub display 105, a picture light 106, and a camera 107. The display 104 or the sub display 105 includes the liquid crystal display device 80.

8. Modifications

While the invention has been described with the embodiments hereinbefore, the invention is not limited to the embodiments, and may be variously modified or altered. For example, each lead frame may have at least three sets of three-dimensional structures, each structure including a lower conductor layer, an insulating layer, and an upper conductor layer. In the first embodiment, for example, a combination of the lower conductor layer 11a, the insulating layer 11b, and the upper conductor layer 11c is one set of the three-dimensional structure. In the second embodiment, when the intermediate conductor layer 41c is considered to be a common layer between upper and lower sets (upper-cum-lower conductor layer), a combination of the lower conductor layer 41a, the insulating layer 41b, the intermediate conductor layer 41c, the insulating layer 41d and the upper conductor layer 41e has two sets of the three-dimensional structures.

While the lower conductor layer, the insulating layer, and the upper conductor layer are stacked in the embodiments, another layer may be included between the layers. In a word, it is enough that a lead frame has a three-dimensional structure including the three layers in such an order. Moreover, a planar shape of each lead frame is not limited to a thin, long and rectangular shape as in the embodiments, and the lead frame may have any shape.

In addition, an element to be mounted in a package is not limited to a light emitting diode, and may be a semiconductor laser. Furthermore, the light-emitting-element mounting package and the light emitting device of the invention are not limitedly used for the backlight or the liquid crystal display device, and may be variously used for other applications.

The present application contains subject matter related to that disclosed in Japanese Priority Patent Application JP 2009-058388 filed in the Japan Patent Office on Mar. 11, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalent thereof.

What is claimed is:

1. A light-emitting-element mounting package comprising:
a plurality of lead frames arranged horizontally side by side, the plurality of lead frames extending into a cavity of a mold portion that contains a phosphor-mixed resin or a transparent resin, each of the lead frames including at least one set of a structure including a lower conductor layer, an insulating layer and an upper conductor layer stacked in a direction of stacking in this order, the lower conductor layer and the upper conductor layer in a first one of the lead frames forming two stacked terminals that are electrically independent of terminals formed by the lower conductor layer and the upper conductor layer in a second one of the lead frames, and the lower conductor layer and the upper conductor layer in each of the plurality of lead frames are configured to be electrically connected to a mounting board so that a side of the plurality of lead frames in the direction of stacking faces a mounting surface of the mounting board that the light-emitting-element mounting package is configured to be mounted on,
in at least one set, an inner end of the insulating layer and an inner end of the upper conductive layer is aligned at an edge and a portion of the lower conductor layer extends further inward from the edge, and
in at least one set, a mounting area is exposed on a surface of the portion of the lower conductor layer that extends further inward from the edge.

2. The light-emitting-element mounting package according to claim 1,
wherein the plurality of lead frames are integrated with a light emitting element by the mold portion.

3. The light-emitting-element mounting package according to claim 2,
wherein bottom layers of the lower conductor layers are common to one another so that the plurality of lead frames are integrated.

4. The light-emitting-element mounting package according to claim 1,
wherein in at least one set, the layers all extend parallel to one another in a direction perpendicular to the direction of stacking.

5. The light-emitting-element mounting package according to claim 1, wherein a thickness of the light-emitting-element mounting package is 0.8 mm or less.

6. The light-emitting-element mounting package according to claim 1, wherein the lower conductor layer in at least the first one of the lead frames includes a double layer structure, and the double layer structure includes an upper layer that is a light reflector and a lower layer that is a heat conductor.

7. The light-emitting-element mounting package according to claim 6, wherein the light reflector includes a reflectance in a wavelength range of red to blue light.

8. A light emitting device, comprising:
a plurality of lead frames arranged horizontally side by side, the plurality of lead frames extending into a cavity of a mold portion that contains a phosphor-mixed resin or a transparent resin, each of the lead frames including at least one set of a structure including a lower conductor layer, an insulating layer and an upper conductor layer stacked in a direction of stacking in this order, the lower conductor layer and the upper conductor layer in a first one of the lead frames forming two stacked terminals that are electrically independent of terminals formed by the lower conductor layer and the upper conductor layer in a second one of the lead frames, and the lower conductor layer and the upper conductor layer in each of the plurality of lead frames are configured to be electrically connected to a mounting board so that a side of the plurality of lead frames in the direction of stacking faces a mounting surface of the mounting board that the light emitting device is configured to be mounted on, in at least one set, an inner end of the insulating layer and an inner end of the upper conductive layer is aligned at an edge and a portion of the lower conductor layer extends further inward from the edge, and in at least one set, a mounting area is exposed on a surface of the portion of the lower conductor layer that extends further inward from the edge; and
a light emitting element including a pair of electrodes while being mounted in the mounting area of the lead frame, the pair of electrodes being electrically connected to the lower conductor layer and the upper conductor layer, respectively.

9. The light emitting device according to claim 8,
wherein both the lower conductor layer and the upper conductor layer are formed of a metal material having high reflectance.

10. The light emitting device according to claim 8,
wherein light emitting elements are mounted on the plurality of lead frames, respectively, and
the plurality of lead frames are integrated with the light emitting elements by the mold portion.

11. The light emitting device according to claim 10,
wherein two lead frames are provided,
a blue light emitting diode is mounted on one of the lead frames, and a red light emitting diode is mounted on the other thereof,
the blue light emitting diode and the red light emitting diode are disposed within the cavity of the mold portion, and
the cavity is filled with resin containing a green phosphor.

12. The light emitting device according to claim 10,
wherein two lead frames are provided, and
a blue light emitting diode, a red light emitting diode, and a green light emitting diode are mounted on the lead frames.

13. The light emitting device according to claim 8,
wherein a bottom layer of the lower conductor layer is formed thick compared with a conductor layer above the bottom layer, and thus acts even as a heat release section, and
heat generated by the light emitting element is released from the lower conductor layer.

14. The light emitting device according to claim 13,
wherein the lower conductor layer acting even as the heat release section includes a second layer having high reflectance formed on a first layer having high heat conductivity.

15. The light emitting device according to claim 14,
wherein a red light emitting element is mounted on the lower conductor layer having heat release capability.

16. The light emitting device according to claim 8, wherein the lower conductor layer in at least the first one of the lead frames includes a double layer structure, and the double layer structure includes an upper layer that is a light reflector and a lower layer that is a heat conductor.

17. A backlight comprising:
a light emitting device emitting white light; and
a light guide plate guiding light emitted from the light emitting device in a planar direction;
wherein the light emitting device includes
a plurality of lead frames arranged horizontally side by side, the plurality of lead frames extending into a cavity of a mold portion that contains a phosphor-mixed resin or a transparent resin, each of the lead frames including at least one set of a structure including a lower conductor layer, an insulating layer and an upper conductor layer stacked in a direction of stacking in this order, the lower conductor layer and the upper conductor layer in a first one of the lead frames forming two stacked terminals that are electrically independent of terminals formed by the lower conductor layer and the upper conductor layer in a second one of the lead frames, and the lower conductor layer and the upper conductor layer in each of the plurality of lead frames are configured to be electrically connected to a mounting board so that a side of the plurality of lead frames in the direction of stacking faces a mounting surface of the mounting board that the light emitting device is configured to be mounted on, in at least one set, an inner end of the insulating layer and an inner end of the upper conductive layer is aligned at an edge and a portion of the lower conductor layer extends further inward from the edge, and in at least one set, a mounting area is exposed on a surface of the portion of the lower conductor layer that extends further inward from the edge, and
a light emitting element including a pair of electrodes while being mounted in the mounting area of the lead frame, the pair of electrodes being electrically connected to the lower conductor layer and the upper conductor layer, respectively.

18. The backlight according to claim 17, wherein the lower conductor layer in at least the first one of the lead frames includes a double layer structure, and the double layer structure includes an upper layer that is a light reflector and a lower layer that is a heat conductor.

19. A liquid crystal display device comprising:
   a backlight including a light emitting device emitting white light, and a light guide plate guiding light emitted from the light emitting device in a planar direction; and
   a liquid crystal display panel polarizing light emitted from the backlight,
   wherein the light emitting device includes
      a plurality of lead frames arranged horizontally side by side, the plurality of lead frames extending into a cavity of a mold portion that contains a phosphor-mixed resin or a transparent resin, each of the lead frames including at least one set of a structure including a lower conductor layer as a first electrode terminal, an insulating layer, and an upper conductor layer as a second electrode terminal stacked in a direction of stacking in this order, the lower conductor layer and the upper conductor layer in a first one of the lead frames forming two stacked terminals that are electrically independent of terminals formed by the lower conductor layer and the upper conductor layer in a second one of the lead frames, and the lower conductor layer and the upper conductor layer in each of the plurality of lead frames are configured to be electrically connected to a mounting board so that a side of the plurality of lead frames in the direction of stacking faces a mounting surface of the mounting board that the light emitting device is configured to be mounted on, in at least one set, an inner end of the insulating layer and an inner end of the upper conductive layer is aligned at an edge and a portion of the lower conductor layer extends further inward from the edge, and in at least one set, a mounting area is exposed on a surface of the portion of the lower conductor layer that extends further inward from the edge, and
      a light emitting element including a pair of electrodes while being mounted in the mounting area of the lead frame, the pair of electrodes being electrically connected to the lower conductor layer and the upper conductor layer, respectively.

20. The liquid crystal display device according to claim 19, wherein the lower conductor layer in at least the first one of the lead frames includes a double layer structure, and the double layer structure includes an upper layer that is a light reflector and a lower layer that is a heat conductor.

* * * * *